United States Patent
Yoshimura

(10) Patent No.: US 6,266,279 B1
(45) Date of Patent: Jul. 24, 2001

(54) NONVOLATILE SEMICONDUCTOR MEMORY DEVICE, METHOD FOR READING DATA FROM THE NONVOLATILE SEMICONDUCTOR MEMORY DEVICE, AND METHOD FOR WRITING DATA INTO THE NONVOLATILE SEMICONDUCTOR MEMORY DEVICE

(75) Inventor: Yoshimasa Yoshimura, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/621,356

(22) Filed: Jul. 21, 2000

(30) Foreign Application Priority Data

Feb. 17, 2000 (JP) ................................. 12-039483

(51) Int. Cl.$^7$ .................................................. G11C 16/00
(52) U.S. Cl. .............................. 365/185.24; 365/185.03
(58) Field of Search .................. 365/185.03, 185.24, 365/185.28

(56) References Cited

U.S. PATENT DOCUMENTS 5,394,359 * 2/1995 Kowalski ...................... 365/185.03
5,394,362 * 2/1995 Banks ........................... 365/185.03
5,412,601 * 5/1995 Sawada et al. ................ 365/185.03
6,026,015 * 2/2000 Hirakawa ...................... 365/185.03

FOREIGN PATENT DOCUMENTS 9-091971   4/1997 (JP).

* cited by examiner

*Primary Examiner*—Tan T. Nguyen
(74) *Attorney, Agent, or Firm*—Oblon, Spivak, McClelland, Maier & Neustadt, P.C.

(57) ABSTRACT

An object is to obtain a nonvolatile semiconductor memory device which can achieve a reduction in processing time required for data writing operation and an increase in storage density through the use of multi-valued MOS transistors. In operation for writing data into cells, the amount of charge injected into the floating gates is controlled so as to set the threshold voltages of the MOS transistors at all different values. When reading data from the cells, the data is read by determining whether the threshold voltages of the MOS transistors are higher or lower relative to each other.

8 Claims, 8 Drawing Sheets

FIG. 8

| INVENTION | | | CONVENTIONAL DEVICE | | |
|---|---|---|---|---|---|
| NUMBER OF MULTI-VALUES N | NUMBER OF CELLS M | NUMBER REPRESENTABLE WITH 1 DATA UNIT | NUMBER OF MULTI-VALUES N | NUMBER OF CELLS M | NUMBER REPRESENTABLE WITH 1 DATA UNIT |
| 4 | 4 | $4!=24$ | 4 | 4 | $4^4=256$ |
| 6 | 6 | $6!=720$ | 4 | 6 | $4^6=4096$ |
| 8 | 8 | $8!=40320$ | 4 | 8 | $4^8=65536$ |
| 9 | 9 | $9!=362880$ | 4 | 9 | $4^9=262144$ |
| 16 | 16 | $16!=2.09 \times 10^{13}$ (44BITS) | 4 | 16 | $4^{16}=4.09 \times 10^9$ (32BITS) |
| 25 | 25 | $25!=1.55 \times 10^{25}$ (83BITS) | 4 | 25 | $4^{25}=1.13 \times 10^{15}$ (50BITS) |
| •••• | •••• | •••• | •••• | •••• | •••• |

NONVOLATILE SEMICONDUCTOR MEMORY DEVICE, METHOD FOR READING DATA FROM THE NONVOLATILE SEMICONDUCTOR MEMORY DEVICE, AND METHOD FOR WRITING DATA INTO THE NONVOLATILE SEMICONDUCTOR MEMORY DEVICE

BACKGROUND OF THE INVENTION

1. Field of the Invention

The present invention relates to nonvolatile semiconductor memory devices, and particularly to a nonvolatile semiconductor multi-valued memory device in which one unit of data is formed by a group of memory cells (hereinafter simply referred to as "cells") each having a transistor whose threshold voltage can be set at multiple values. The present invention also relates to a method for reading data from the nonvolatile semiconductor memory device and a method for writing data into the nonvolatile semiconductor memory device.

2. Description of the Background Art

A conventional nonvolatile semiconductor multi-valued memory device is disclosed in Japanese Patent Application Laid-Open No.9-91971 (1997), for example. FIGS. 9A to 9D are diagrams used to explain a method for writing data into the conventional nonvolatile semiconductor multi-valued memory device described in the reference. FIGS. 9A to 9D show an example in which four MOS transistors 101 to 104 are connected to one word line W and four cells C1 to C4 form a unit of data. The MOS transistors 101 to 104 each have a control gate and a floating gate, where the threshold voltage Vth can be set at four values Vth1 to Vth4 (Vth1<Vth2<Vth3<Vth4) according to the amount of charge exiting in the floating gate. Its writing operation is now described in an example in which the threshold voltages Vth of the MOS transistors 101, 102, 103 and 104 are set at Vth4, Vth3, Vth2 and Vth1, respectively.

First, as shown in FIG. 9(A), the threshold voltages Vth of the MOS transistors 101 to 104 are all set at the highest value Vth4. At this time, electrons are sufficiently stored in the floating gates of the MOS transistors 101 to 104. Next, as shown in FIG. 9(B), a given amount of electrons are discharged from the floating gates of the MOS transistors 102 to 104 to set the threshold voltages Vth of the MOS transistors 102 to 104 at Vth3, which is followed by a verification. Next, as shown in FIG. 9(C), a given amount of electrons are discharged from the floating gates of the MOS transistors 103 and 104 to set the threshold voltages Vth of the MOS transistors 103 and 104 at Vth2, which is followed by a verification. Finally, as shown in FIG. 9(D), a given amount of electrons are discharged from the floating gate of the MOS transistor 104 to set the threshold voltage Vth of the MOS transistor 104 at Vth1, which is followed by a verification.

FIG. 10 is a diagram used to explain a method for reading data from the conventional nonvolatile semiconductor multi-valued memory device described in the reference mentioned above. In the reading operation in the conventional nonvolatile semiconductor multi-valued memory device, an MOS transistor whose threshold voltage Vth is in the range of V6 or higher is regarded as an MOS transistor having the threshold voltage Vth4, an MOS transistor whose threshold voltage Vth is in the range of V4 to V5 is regarded as an MOS transistor having the threshold voltage Vth3, an MOS transistor whose threshold voltage Vth is in the range of V2 to V3 is regarded as an MOS transistor having the threshold voltage Vth2, and an MOS transistor whose threshold voltage Vth is in the range of V1 or lower is regarded as an MOS transistor having the threshold voltage Vth1.

As explained above, the conventional nonvolatile semiconductor multi-valued memory device manages and controls the threshold voltages of a plurality of MOS transistors by using the absolute voltage values (absolute values) Vth1, Vth2, Vth3 and Vth4 (or V1, V2, V3, V4, V5 and V6). When a plurality of MOS transistors are formed on a chip, all MOS transistors do not have completely the same physical characteristics; actually, there are variations in characteristics among the MOS transistors. Accordingly, some MOS transistors are quick at writing (that is to say, for the same writing stress, some MOS transistors allow a larger amount of charge to be discharged from or injected into the floating gate than other MOS transistors, so that the threshold voltage shifts more largely) and some MOS transistors are slow at writing.

Accordingly, as in the conventional nonvolatile semiconductor multi-valued memory device, controlling the threshold voltages of a plurality of MOS transistors having different characteristics by using absolute voltage values requires repeating the above-described flow of: with the write time divided into a plurality of small unit times, applying a given write stress to shift the threshold voltages for each small unit time, verifying the threshold voltages each time, and applying a write stress again if the threshold voltages have not attained a defined range. The conventional nonvolatile semiconductor multi-valued memory device thus has the problem that the processing takes time especially in data writing operation.

In the nonvolatile semiconductor multi-valued memory devices, it is possible to increase the storage capacity per unit area (i.e. storage density) by increasing the number of multiple values of each MOS transistor. However, when the number of multiple values of the MOS transistors is increased in the above-described conventional nonvolatile semiconductor multi-valued memory device, the writing operation takes a still longer time and the threshold voltage of the MOS transistors must be divided into a larger number of smaller ranges, leading to processing speed reduction and accuracy reduction in data processing. It is then difficult to enhance the storage density by using multiple-valued MOS transistors.

SUMMARY OF THE INVENTION

According to a first aspect of the present invention, a nonvolatile semiconductor memory device comprises a memory cell array in which a plurality of memory cells are arranged, wherein each memory cell comprises a transistor whose threshold voltage can be variably set and one unit of data is formed by a plurality of memory cells in a group in the memory cell array, and wherein the threshold voltages of the transistors in the plurality of memory cells belonging to the one unit of data are all set at different values.

Preferably, according to a second aspect of the invention, in the nonvolatile semiconductor memory device, the threshold voltage of each transistor can be set at N values (N is a natural number of 2 or more) and the one unit of data is formed by a group of M memory cells (M is a natural number of not less than 2 nor more than N).

Preferably, according to a third aspect of the invention, N=M in the nonvolatile semiconductor memory device.

Preferably, according to a fourth aspect of the invention, in the nonvolatile semiconductor memory device, the M memory cells are formed adjacent to each other in the substrate on which the nonvolatile semiconductor memory device is formed.

A fifth aspect of the present invention is directed to a method for reading data from the nonvolatile semiconductor memory device of the invention, and the method comprises the steps of: (a) specifying one reference memory cell from among the plurality of memory cells belonging to the one unit of data; (b) determining whether the threshold voltages of the transistors in the memory cells other than the reference memory cell are relatively higher or lower than the threshold voltage of the transistor in the reference memory cell; and (c) repeatedly performing the steps (a) and (b) until all of the plurality of memory cells belonging to the one unit of data have been specified as the reference memory cell.

Preferably, according to a sixth aspect of the present invention, in the method for reading data from the nonvolatile semiconductor memory device of the invention, the nonvolatile semiconductor memory device further comprises a shorting circuit for selectively short-circuiting the transistors between their control gate and drain, and in the step (a), a memory cell which is shorted between the control gate and the drain by the shorting circuit is specified as the reference memory cell.

A seventh aspect of the invention is directed to a method for writing data into the nonvolatile semiconductor memory device of the invention, wherein each transistor has a control gate and a floating gate and the threshold voltage is variably set in accordance with the amount of charge injected to the floating gate, and wherein at least one of the time for injecting the charge into the floating gate and a voltage value applied to the control gate to inject the charge into the floating gate is set at different values relative to each other among the plurality of memory cells belonging to the one unit of data.

According to the device of the first aspect of the invention, the threshold voltages of a plurality of transistors are set at all different values among a plurality of memory cells forming one unit of data. Accordingly, in the operation of reading data, data can be read easily by comparing the threshold voltages of the transistors with each other to see whether they are higher or lower relative to each other. Further, in the operation of writing data, data can be written in a shorter time by one writing operation just by establishing the relation among the threshold voltages of the MOS transistors as to whether they are higher or lower relative to each other.

In the plurality of memory cells forming one unit of data, the threshold voltages of the transistors are set merely to establish the relation as to whether they are higher or lower relative to each other, and the relation among relative values is not affected much by the variations in physical characteristics among the transistors. Accordingly, the number of multiple values of the transistors can be easily increased and therefore a nonvolatile semiconductor memory device with larger capacity can be obtained easily.

According to the device of the second aspect of the invention, when the threshold voltage of each transistor can be set at N levels, one unit of data is formed by a group composed of M memory cells, where M is equal to or smaller than N. Accordingly, in a plurality of memory cells forming one unit of data, the threshold voltages of the plurality of transistors can be set at all different values.

According to the device of the third aspect of the invention, when the threshold voltage of each transistor can be set at N levels, one unit of data is formed by a group of N memory cells, so that the storage capacity per unit area can be maximized.

According to the device of the fourth aspect of the invention, the plurality of memory cells forming one unit of data are formed adjacent to each other, which reduces variations among the plurality of transistors contained in the plurality of memory cells which are caused in manufacture process depending on the position in the substrate.

According to the method of the fifth aspect of the invention, whether the threshold voltages of the transistors other than that in the reference memory cell are higher or lower than the threshold voltage of the transistor in the reference memory cell is determined not by using absolute voltage values but by simply comparing them with each other. Accordingly, this determination can be made easily and the processing time can be reduced.

According to the method of the sixth aspect of the invention, the reference memory cell can be specified by simple structure and operation using the shorting circuit.

According to the method of the seventh aspect of the invention, the relation among the threshold voltages of the transistors as to whether they are higher or lower relative to each other can be established by one writing operation.

The present invention has been made to solve the above-described problems, and an object of the present invention is to obtain a nonvolatile semiconductor memory device which can achieve a reduction in processing time especially in data writing operation and an increase in storage density through the use of multi-valued MOS transistors. Another object of the present invention is to obtain a method for reading data from the nonvolatile semiconductor memory device and a method of writing data into the nonvolatile semiconductor memory device.

These and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram showing the number of representations which can be expressed with one data unit, where the number of multiple values, N, of the MOS transistors and the number of cells, M, in one digit are varied under the condition of N=M.

DESCRIPTION OF THE PREFERRED EMBODIMENTS

The present invention relates to a nonvolatile semiconductor multi-valued memory device in which one unit of data (hereinafter referred to as "one digit") is formed by a group of cells each having an MOS transistor capable of setting its threshold voltage at multiple values. For simplicity of the description, the nonvolatile semiconductor multi-valued memory device will be described in an example in which one digit is composed of a group of four cells and each cell has an MOS transistor capable of setting its threshold voltage at four values.

Figure 1:
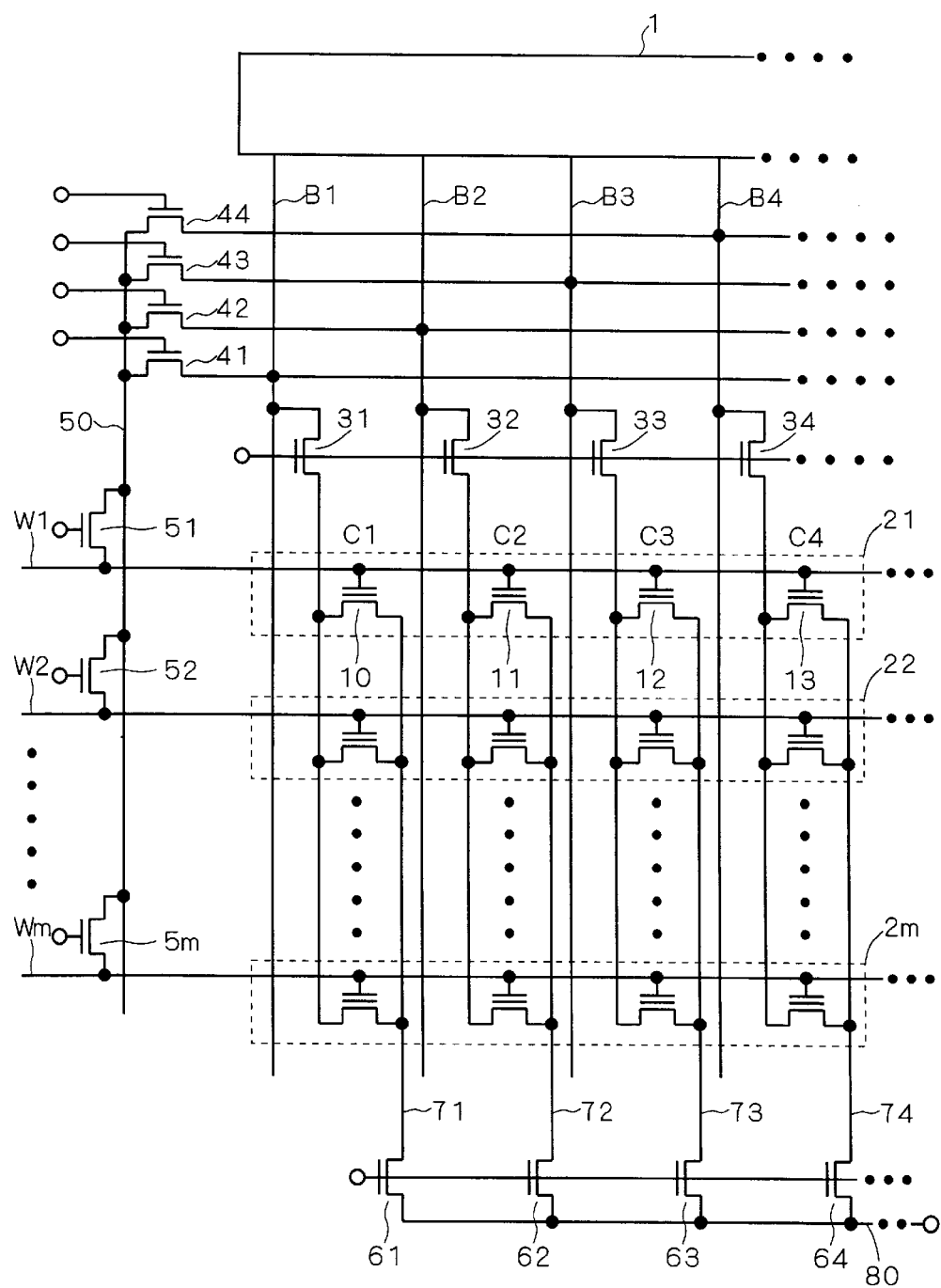
FIG. 1 is a circuit diagram showing the entire structure of a nonvolatile semiconductor memory device according to a preferred embodiment of the present invention.

FIG. 1 is a circuit diagram showing the entire structure of a nonvolatile semiconductor memory device according to a preferred embodiment of the invention. The memory cell array is sectioned into a plurality of groups 21 to 2m each forming one digit (m is a natural number equal to or larger than 3 in the example shown in FIG. 1). Its structure and operation will now be described referring to the group 21.

The group 21 is composed of four cells C1 to C4. The cells C1 to C4 respectively include MOS transistors 10 to 13 each having a control gate and a floating gate. The control gates of the MOS transistors 10 to 13 are connected to the word line W1 in common. It is desired that the four cells C1 to C4 forming one digit are formed adjacent to each other in the chip. This reduces the variations among the MOS transistors 10 to 13 which are caused in manufacture process depending on their position in the chip. As a result, the manufacture yield can be enhanced to reduce the cost.

The peripheral circuit 1 has a function as a constant current source and voltage sense portion. A plurality of bit lines are connected to the peripheral circuit 1. FIG. 1 only shows four bit lines B1 to B4. MOS transistors 41 to 44 for selecting a reference cell in data reading operation have their respective first electrodes (sources in the case of PMOS) connected respectively to the bit lines B1 to B4. The second electrodes (drains in the case of PMOS) of the MOS transistors 41 to 44 are connected to the signal line 50. MOS transistors 51 to 5m for selecting a desired word line in data reading operation have their respective first electrodes (sources in the case of PMOS) connected to the signal line 50. The second electrodes (drains in the case of PMOS) of the MOS transistors 51 to 5m are connected to the word lines W1 to Wm, respectively.

MOS transistors 31 to 34 have their respective first electrodes (sources in the case of PMOS) connected to the bit lines B1 to B4, respectively. The second electrodes (drains in the case of PMOS) of the MOS transistors 31 to 34 are connected to the drains of the MOS transistors 10 to 13, respectively. The sources of the MOS transistors to 13 are connected to the first electrodes (sources in the case of PMOS) of MOS transistors 61 to 64 through signal lines 71 to 74, respectively. The second electrodes (drains in the case of PMOS) of the MOS transistors 61 to 64 are connected to the signal line 80.

Figure 2:
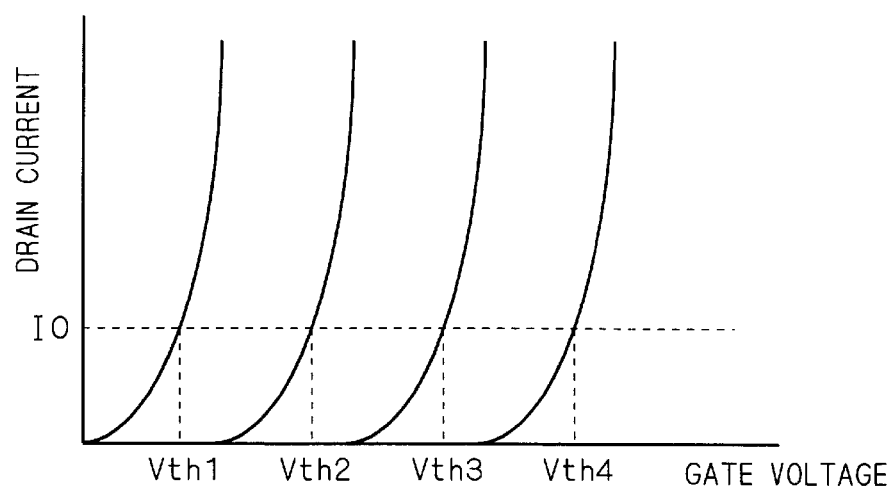
FIG. 2 is a graph showing the gate voltage versus drain current characteristic of an MOS transistor whose threshold voltage can be set at four values.
Figure 3:
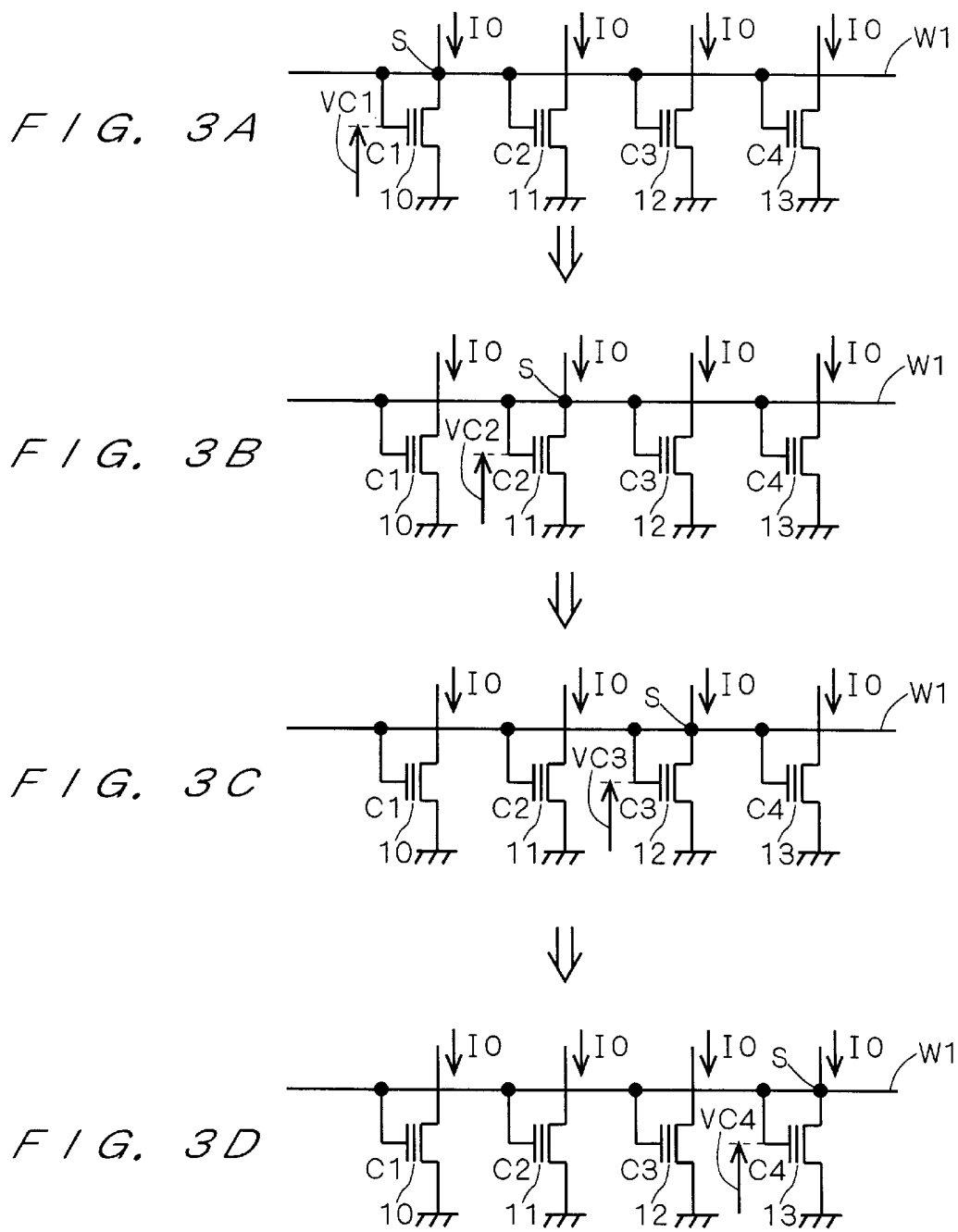
FIGS. 3A to 3D are diagrams used to explain the operation of reading data from cells C1 to C4.

FIG. 2 is a graph showing the gate voltage versus drain current characteristic of an MOS transistor whose threshold voltage can be set at four values. The threshold voltage of the MOS transistor can be recognized as the gate voltage value exhibited when the drain current is at a certain value I0. In the example shown in FIG. 2, the threshold voltage of the MOS transistor can be set at four values Vth1 to Vth4 (Vth1<Vth2<Vth3<Vth4). While the threshold voltage Vth1 corresponds to a state in which a minimum amount of charge exists in the floating gate after data write operation is finished, the threshold voltage Vth4 corresponds to a state in which a maximum amount of charge exists in the floating gate after data write operation is finished.

When writing data into the cells C1 to C4, the amount of charge injected into the floating gates is controlled so that the threshold voltages of the MOS transistors 10 to 13 all differ from each other. In this example, it is assumed that the threshold voltages of the MOS transistors 10, 11, 12 and 13 are set at Vth2, Vth1, Vth3 and Vth4, respectively. When a group of four cells form one digit and each cell has an MOS transistor capable of setting its threshold value at four values as in this example, the number of states, D, which one digit can take (i.e. the number of representations which can be expressed with one data unit) is D=4×3×2×1=24.

FIGS. 3A to 3D are diagrams illustrating operation of reading data from the cells C1 to C4. The data reading operation will now be described referring to FIGS. 1 and 3. First, one reference cell is specified from among the cells C1 to C4. Suppose that the cell C1 is specified. Next, the MOS transistor 41 connected to the bit line B1 corresponding to the specified cell C1 is turned on. The MOS transistor 51 connected to the word line W1 corresponding to the group 21 is turned on, too. Next, a constant current I0 is passed to the bit lines B1 to B4 from the peripheral circuit 1 and the MOS transistors 31 to 34 are turned on. The MOS transistors 61 to 64, too, are turned on, and the potential of the signal line 80 is set at the ground potential GND. Then the gate and drain of the MOS transistor 10 are shorted through the MOS transistors 31, 41, 51, bit line B1, signal line 50 and word line W1 (this short-circuit is shown by "S" in FIG. 3) and the constant current I0 flows to the source of the MOS transistor 10 (FIG. 3(A)). As a result, the gate-source voltage VC1 of the MOS transistor becomes equal to the threshold voltage Vth2, and this voltage VC1 is applied to the gates of the other MOS transistors 11 to 13 through the word line W1.

Figure 4:
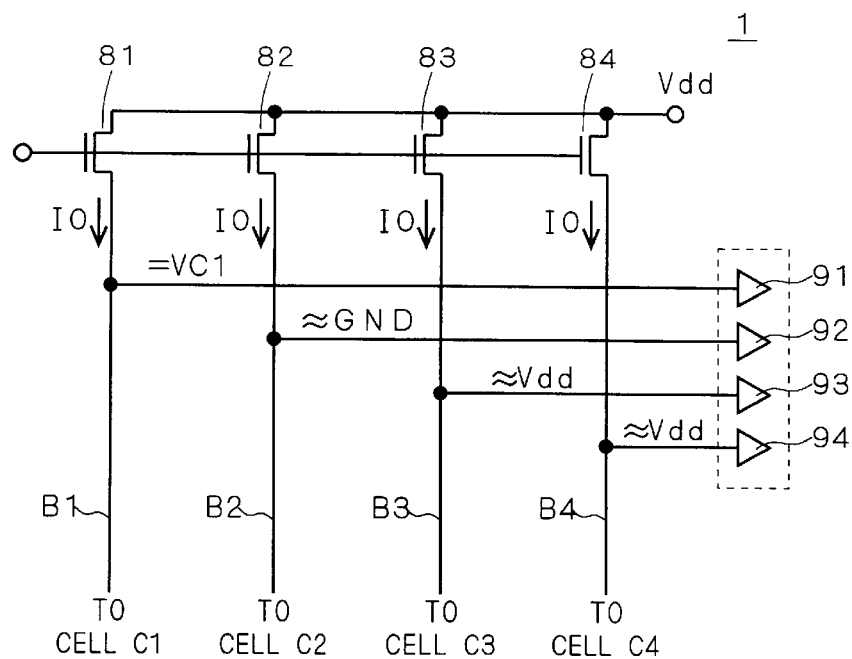
FIG. 4 is a circuit diagram showing a specific example of the structure of the peripheral circuit.
Figure 5:
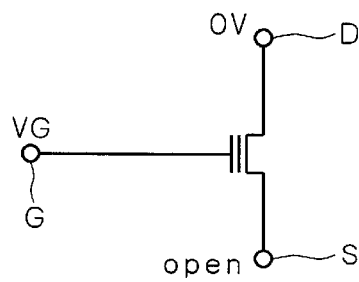
FIG. 5 is a diagram showing the relation among voltages to be applied to the electrodes of an MOS transistor to write data.

FIG. 4 is a circuit diagram showing a specific example of the structure of the peripheral circuit 1. MOS transistors 81 to 84 have their respective first electrodes (sources in the case of PMOS) connected to a power source Vdd, and their second electrodes (drains in the case of PMOS) are connected to the bit lines B1 to B4, respectively. When supplied with a given voltage at their respective gates, the MOS transistors 81 to 84 can supply the constant current I0 to the bit lines B1 to B4, respectively. Voltage sense circuits 91 to 94 for detecting the voltage on the bit lines B1 to B4 are connected to the bit lines B1 to B4, respectively.

As shown in FIG. 3(A), when the cell C1 is specified as a reference cell, the voltage VC1 equal to the threshold voltage Vth2 of the MOS transistor 10 is applied to the gates of other MOS transistors 11 to 13. Then, because the threshold voltage Vth1 of the MOS transistor 11 is lower than Vth2, the MOS transistor 11 turns on when the voltage VC1 is applied to its gate. As a result, the bit line B2 comes to conduct to the signal line 80 through the MOS transistors 32 and 11, signal line 72 and MOS transistor 62 in this order and the voltage of the bit line B2 becomes approximately equal to the ground potential GND. On the other hand, since the threshold voltages Vth3 and Vth4 of the MOS transistors 12 and 13 are higher than Vth2, the MOS transistors 12 and 13 do not turn on even when the voltage VC1 is applied to their gates. As a result, the constant current I0 does not flow on the bit lines B3 and B4, so that the voltage of the bit lines B3 and B4 remains approximately at the power-supply potential Vdd. The voltages on the bit lines B2 to B4 are sensed respectively by the voltage sense circuits 92 and 94. Then, according to whether the bit line voltage has varied to the ground potential GND or stays at the power-supply potential Vdd, it can be determined in a relative manner whether the threshold voltages of the MOS transistors 11 to 13 are each higher or lower than the threshold voltage of the MOS transistor 10.

As shown in FIGS. 3(B) to (D), this operation is repeated while sequentially specifying the remaining cells C2 to C4 as the reference cell, so as to determine whether the threshold voltages of the MOS transistors 10 to 13 are higher or lower relative to each other. In other words, data can be read from the cells C1 to C4.

Generally, when the threshold voltage of each MOS transistor can be set at N levels (N is a natural number of 2 or more), the threshold voltages of the plurality of MOS transistors in one digit of cells can be set at all different values as long as one digit is formed by a group of M cells (M is a natural number of not less than 2 nor more than N). However, setting N=M is desirable to maximize the storage capacity per unit area in the memory cell array.

While the operation of writing data into the cells C1 to C4 and the operation of erasing the data can be achieved by a conventional method, a data writing method suited to the nonvolatile semiconductor memory device of this preferred embodiment will now be suggested.

Figure 6:
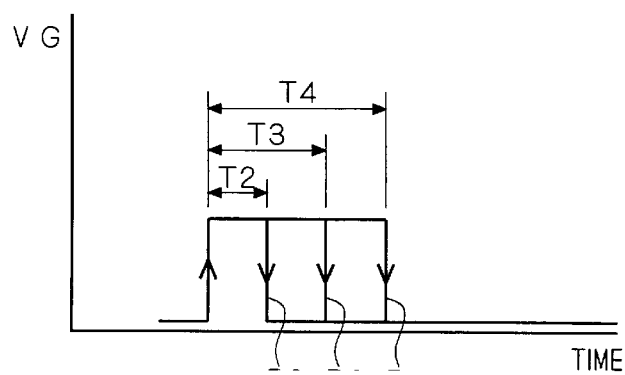
FIG. 6 is a timing chart showing the waveforms of write pulses to be applied between the control gate and drain of the MOS transistor when writing data.

FIG. is a diagram showing the relation of voltages applied to the electrodes of an MOS transistor to write data by using the Fowler-Nordheim tunnel effect. A high voltage VG is applied between the control gate and drain with the source opened. For example, 0 V is applied to the drain and 17 V is applied to the control gate. FIG. 6 is a timing chart showing the waveforms of write pulses applied between the control gate and drain in the MOS transistors 10 to 13 in data writing operation. No write pulse is applied to the MOS transistor 11 whose threshold voltage is to be set at Vth1. This operation can be realized by continuously applying the high voltage VG to the bit line B2 while applying the high voltage VG also to the word line W1 in FIG. 1. Then, in the MOS transistor 11, no charge is injected in the floating gate. A write pulse P2 having a pulse width T2 is applied to the MOS transistor whose threshold voltage is to be set at Vth2. This operation can be realized by applying 0V to the bit line B1 for a time period corresponding to the pulse width T2 with the high voltage VG applied to the word line W1. Similarly, write pulses P3 and P4 having pulse widths T3 and T4 (T2<T3<T4) are applied to the MOS transistors 12 and 13 whose threshold voltages are set at Vth3 and Vth4, respectively. In this operation, the write pulses P2 to P4 have a constant voltage value at VG (the voltage value between the control gate and drain).

Figure 7:
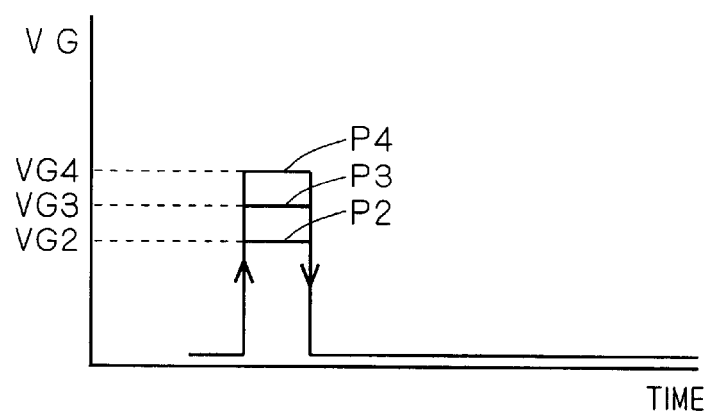
FIG. 7 is a timing chart showing the waveforms of write pulses of another type to be applied between the control gate and drain of the MOS transistor when writing data.
Figure 9A:
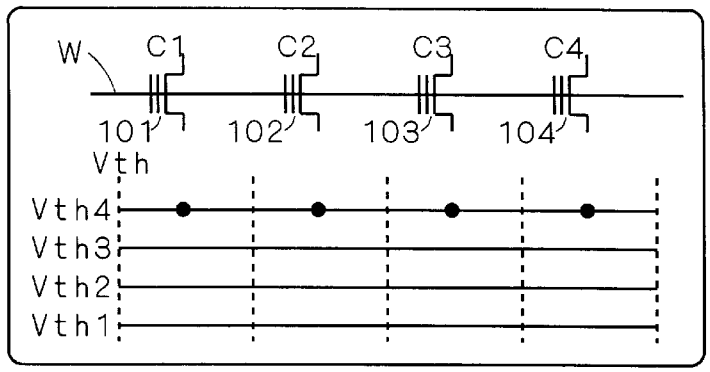
FIGS. 9A to 9D are diagrams used to explain a method of writing data in a conventional nonvolatile semiconductor multi-valued memory device.
Figure 9B:
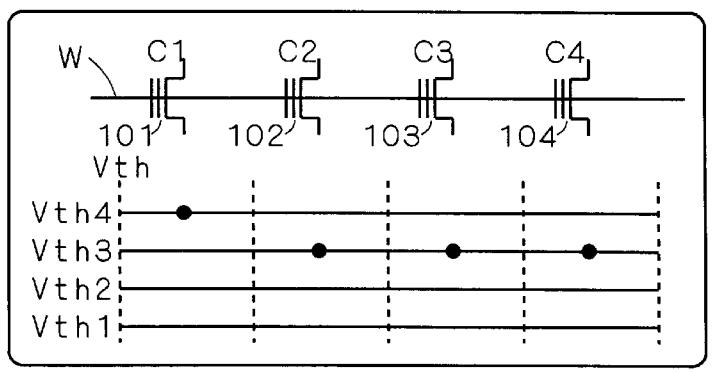
Figure 9C:
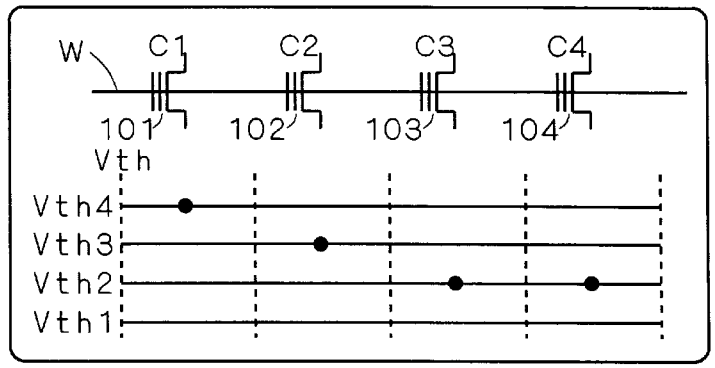
Figure 9D:
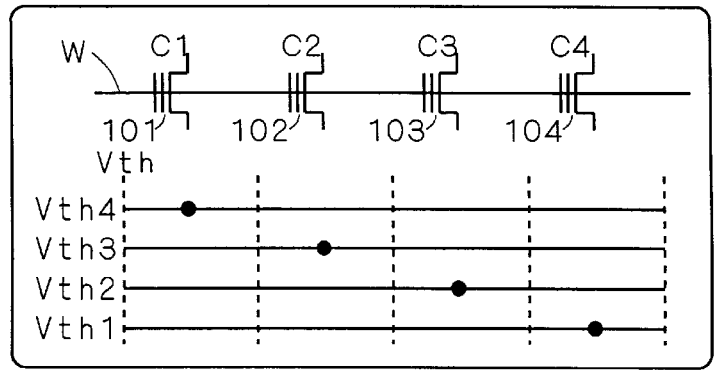
Figure 10:
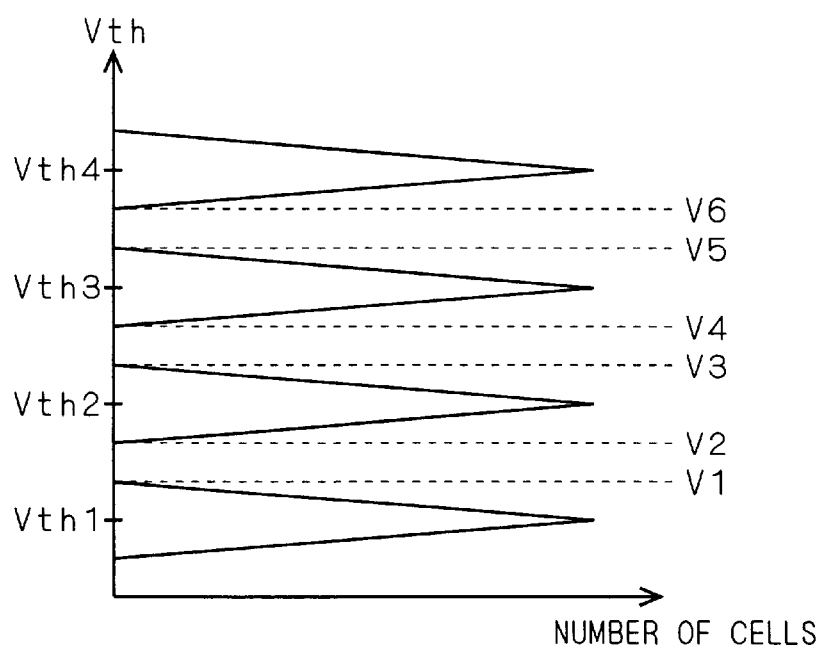
FIG. 10 is a diagram used to explain a method of reading data in the conventional nonvolatile semiconductor multi-valued memory device.

FIG. 7 is a timing chart showing the waveforms of other write pulses to be applied between the control gate and drain in the MOS transistors 10 to 13 in the data writing operation. As in the operation explained above, no write pulse is applied to the MOS transistor 11 whose threshold voltage is to be set at Vth1. A write pulse P2 having a voltage value VG2 is applied to the MOS transistor whose threshold voltage is set at Vth2. Similarly, write pulses P3 and P4 having voltage values VG3 and VG4 (VG2<VG3<VG4) are applied to the MOS transistors 12 and 13 whose threshold voltages are set at Vth3 and Vth4, respectively. At this time, the write pulses P2 to P4 have a constant pulse width.

As shown in FIGS. 6 and 7, the relation among the threshold voltages of the MOS transistors 10 to 13 as to whether they are higher or lower relative to each other can be established by setting at least one of the pulse width and voltage value of the write pulses at different values relative to each other among the cells C1 to C4. In other words, data can be written in the cells C1 to C4.

While the description above has shown an example in which the threshold voltage of the MOS transistor in each cell is set at four values, it can be set at five or more values. FIG. 8 is a diagram showing the number of representations expressed by one data unit when the number of multiple values, N, of the MOS transistors and the number of cells, M, in one digit are varied under the condition of N=M. For comparison with this invention, FIG. 8 also shows the number of representations expressed by one data unit in a conventional device when the number of cells, M, is varied with the number of multiple values, N, set constant at 4. Referring to FIG. 8, it is seen that one data unit in the present invention can express a larger number of numbers, or can store a larger amount of information, than the conventional device when N=M=9 or more.

As described so far, in a plurality of cells forming one digit in the nonvolatile semiconductor memory device of the preferred embodiment, all of the threshold voltages of the plurality of MOS transistors are set at different values. Accordingly, in the operation of reading data, data can be read easily by comparing the threshold voltages of the MOS transistors with each other to determine the levels of the threshold voltages relative to each other. Further, in the operation of writing data, data can be written in a shorter time by single writing operation just by establishing the relation among the threshold voltages of the MOS transistors as to whether they are higher or lower relative to each other.

In a plurality of memory cells forming one digit, the threshold voltages of the MOS transistors are set merely to establish the relation as to whether they are higher or lower relative to each other, and the relation among relative values is not much affected by the variations in physical characteristics among the MOS transistors. Accordingly, as compared with a conventional nonvolatile semiconductor multi-valued memory device which controls the threshold voltages of a plurality of MOS transistors by using absolute voltage values, the number of multiple values of the MOS transistors can be easily increased and therefore a nonvolatile semiconductor multi-valued memory device with larger capacity can be obtained easily.

According to the method of reading data from the nonvolatile semiconductor memory device of this preferred embodiment, whether the threshold voltages of the MOS transistors other than that in the reference cell are higher or lower than the threshold voltage of the MOS transistor in the reference cell is determined in a relative manner just by comparison, not by using absolute voltage values as in conventional devices. Accordingly the determination can be made easily and the processing time can be reduced.

Furthermore, according to the method of writing data into the nonvolatile semiconductor memory device of this preferred embodiment, the relative levels among the threshold voltages of the MOS transistors can be established by one writing operation, which reduces the time required for the data writing operation.

While the invention has been described in detail, the foregoing description is in all aspects illustrative and not restrictive. It is understood that numerous other modifications and variations can be devised without departing from the scope of the invention.

What is claimed is:

1. A nonvolatile semiconductor memory device which comprises a memory cell array in which a plurality of memory cells are arranged, wherein each said memory cell comprises a transistor whose threshold voltage can be variably set, in said memory cell array, one unit of data is formed by a plurality of said memory cells in a group, and said threshold voltages of said transistors in said plurality of memory cells belonging to said one unit of data are all set at different values.

2. The nonvolatile semiconductor memory device according to claim 1, wherein said threshold voltage of each said transistor can be set at N values (N is a natural number of 2 or more), and said one unit of data is formed by a group of M of said memory cells (M is a natural number of not less than 2 nor more than N).

3. The nonvolatile semiconductor memory device according to claim 2, wherein N=M.

4. The nonvolatile semiconductor memory device according to claim 3, wherein N is 9 or more.

5. The nonvolatile semiconductor memory device according to claim 2, wherein said M memory cells are formed adjacent to each other in the substrate on which said nonvolatile semiconductor memory device is formed.

6. A method for reading data from said nonvolatile semiconductor memory device according to claim 1, comprising the steps of:

(a) specifying one reference memory cell from among said plurality of memory cells belonging to said one unit of data;

(b) determining whether said threshold voltages of said transistors in said memory cells other than said reference memory cell are relatively higher or lower than said threshold voltage of said transistor in said reference memory cell; and (c) repeatedly performing said steps (a) and (b) until all of said plurality of memory cells belonging to said one unit of data have been specified as said reference memory cell.

7. The method for reading data from said nonvolatile semiconductor memory device according to claim 6, wherein said nonvolatile semiconductor memory device further comprises a shorting circuit for selectively short-circuiting said transistors between their control gate and drain, and in said step (a), said memory cell which is shorted between said control gate and said drain by said shorting circuit is specified as said reference memory cell.

8. A method for writing data into said nonvolatile semiconductor memory device according to claim 1, wherein each said transistor has a control gate and a floating gate, said threshold voltage is variably set in accordance with the amount of charge injected to said floating gate, and at least one of the time for injecting said charge into said floating gate and a voltage value applied to said control gate to inject said charge into said floating gate is set at different values relative to each other among said plurality of memory cells belonging to said one unit of data.

* * * * *